(12) United States Patent
Cheng et al.

(10) Patent No.: US 9,007,770 B2
(45) Date of Patent: *Apr. 14, 2015

(54) ELECTRONIC DEVICE

(71) Applicants: Inventec (Pudong) Technology Corporation, Shanghai (CN); Inventec Corporation, Taipei (TW)

(72) Inventors: Yi-Lun Cheng, Taipei (TW); Ming-Hung Lin, Taipei (TW); Chun-Lung Lin, Taipei (TW)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 136 days.

This patent is subject to a terminal disclaimer.

(21) Appl. No.: 13/796,208

(22) Filed: Mar. 12, 2013

(65) Prior Publication Data

US 2014/0118942 A1 May 1, 2014

(30) Foreign Application Priority Data

Oct. 31, 2012  (CN) .......................... 2012 1 0427480

(51) Int. Cl.
| | | |
|---|---|---|
| H05K 7/00 | (2006.01) | |
| G06F 1/16 | (2006.01) | |
| G06F 1/20 | (2006.01) | |
| H05K 7/20 | (2006.01) | |

(52) U.S. Cl.
CPC .............. *G06F 1/1626* (2013.01); *G06F 1/203* (2013.01); *H05K 7/20436* (2013.01)

(58) Field of Classification Search
USPC ........................................ 361/700; 257/77, 76
See application file for complete search history.

(56) References Cited

U.S. PATENT DOCUMENTS

| | | | | |
|---|---|---|---|---|
| 5,660,318 | A | * | 8/1997 | Jung et al. ..................... 228/102 |
| 2013/0112993 | A1 | * | 5/2013 | Hayashi et al. ................. 257/77 |

* cited by examiner

*Primary Examiner* — Andargie M Aychillhum
(74) *Attorney, Agent, or Firm* — Huffman Law Group, PC

(57) ABSTRACT

An electronic device includes a housing, a heat source located in the housing, and a heat dissipation device disposed in the housing. The heat dissipation device thermally contacts the heat source. The heat dissipation device includes a casing. A heat dissipation material is disposed in the casing. The heat dissipation material includes 15 to 30 percent volume of multiple copper materials, 50 to 85 percent volume of a phase change material and 15 to 20 percent volume of air. The heat dissipation device has a surface thermally contacting the heat source. A central area and an outer ring area are defined on the surface. The outer ring area surrounds the central area. A geometric midpoint of the central area overlaps that of the surface. The heat source is located in the outer ring area. The heat dissipation device absorbs heat from the heat source through thermal conduction.

19 Claims, 3 Drawing Sheets

ELECTRONIC DEVICE

CROSS-REFERENCE TO RELATED APPLICATIONS

This non-provisional application claims priority under 35 U.S.C. §119(a) on Patent Application No(s). 201210427480.0 filed in China on Oct. 31, 2012, the entire contents of which are hereby incorporated by reference.

BACKGROUND

1. Technical Field

The disclosure relates to an electronic device, and more particularly to an electronic device having a heat dissipation device.

2. Related Art

With the constant development of technology, daily necessities increasingly depend on digitization and computerization. For example, a mobile processing device, such as a notebook computer or a tablet computer, is easily carried by a user, so as to be freely used by the user in any occasions.

Typically, a set of heat dissipation fins and a fan are disposed in the mobile processing device to remove heat generated by the mobile processing device. Improvements in arithmetic processing performance of the mobile processing device are typically coupled with corresponding increases in heat generated. To dissipate the additional heat, manufacturers conventionally increase the fan power and the heat dissipation area of the heat dissipation fins, so as to improve the heat dissipation efficiency of the mobile processing device.

Under existing trends of technology development, researchers devote significant efforts to continuously developing the mobile processing device toward the objectives of having ever higher performances in ever more compact designs. However, increases of the heat dissipation area of the heat dissipation fins and the power of the fan are coupled with increases in the internal volume of the mobile processing device. This impedes the objective of developing the mobile processing device with a compact design.

SUMMARY

In one embodiment, an electronic device comprises a housing, a heat source, and a heat dissipation device. The heat source is located inside the housing. The heat dissipation device is disposed inside the housing, and the heat dissipation device is in thermal contact with the heat source. The heat dissipation device comprises a casing. A heat dissipation material is disposed in the casing. The heat dissipation material comprises 15 to 30 percent volume of multiple copper materials, 50 to 85 percent volume of a phase change material, and 15 to 20 percent volume of air. The casing has a surface which is thermal contact with the heat source. A central area and an outer ring area are defined on the surface. The outer ring area surrounds the central area. A geometric midpoint of the central area and a geometric midpoint of the surface overlap each other. The area of the central area is 10% to 50% of the area of the surface. The heat source is located in the outer ring area. The heat dissipation device absorbs heat from the heat source through thermal conduction.

In another embodiment, an electronic device comprises a heat source, a housing enclosing the heat source, and a heat dissipation device. The heat dissipation device comprises air and phase change material enclosed within a casing. The air is more compressible than the phase change material so that the air gives up volume to the phase change material as the phase change material changes phase to absorb heat. The heat source directly contacts the casing in an outer ring area of the casing. Copper tubes or plates are disposed within the casing to distribute heat through the casing. The casing is in direct contact with, is eccentrically located with respect to, the heat source.

BRIEF DESCRIPTION OF THE DRAWINGS

The disclosure will become more fully understood from the detailed description given herein below for illustration only, and thus is not limitative of the disclosure, and wherein.

DETAILED DESCRIPTION

The detailed features and advantages of the disclosure are described below in great detail through the following embodiments, the content of the detailed description is sufficient for those skilled in the art to understand the technical content of the present disclosure and to implement the disclosure there accordingly. Based upon the content of the specification, the claims, and the drawings, those skilled in the art can easily understand the relevant objectives and advantages of the disclosure.

Figure 1:
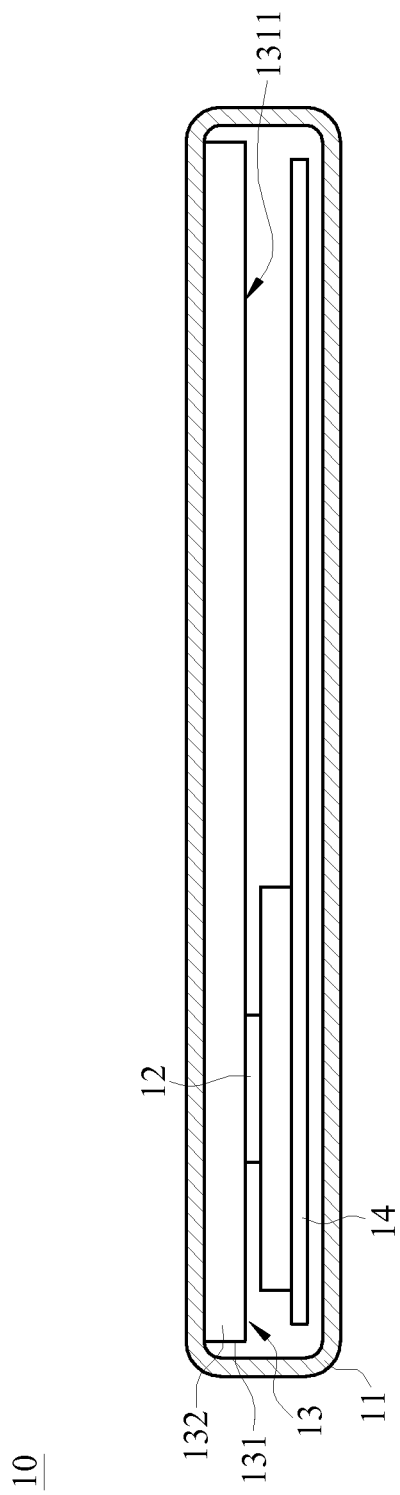
FIG. 1 is a sectional view of an electronic device according to an embodiment of the disclosure.
Figure 2:
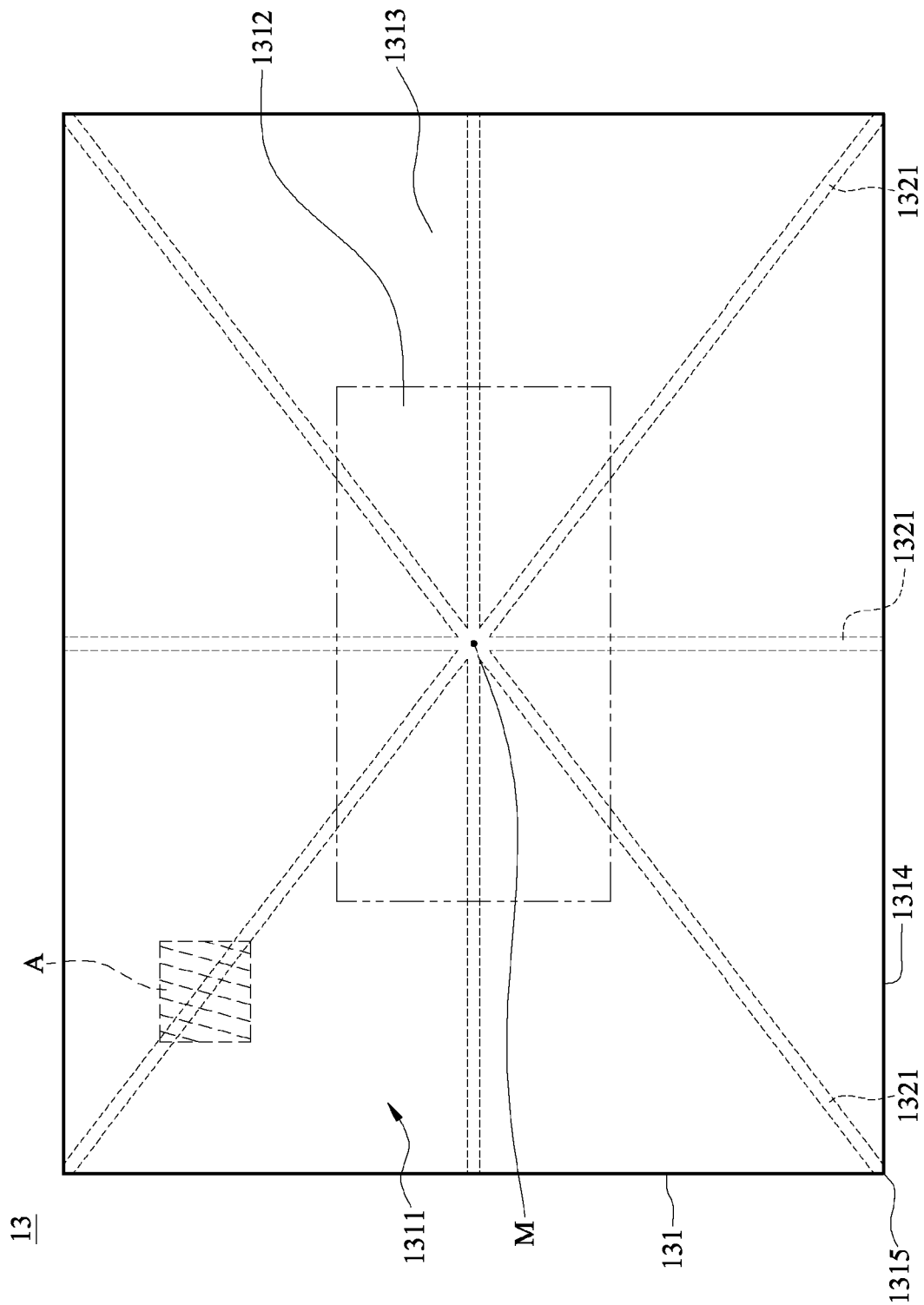
FIG. 2 is a bottom view of a heat dissipation device in FIG. 1.

Referring to FIG. 1 and FIG. 2, FIG. 1 is a sectional view of an electronic device according to an embodiment of the disclosure, and FIG. 2 is a bottom view of a heat dissipation device in FIG. 1.

An electronic device 10 of this embodiment comprises a housing 11, a heat source 12, and a heat dissipation device 13. In this embodiment and some other embodiments, the electronic device 10 is a tablet computer, a mobile phone, or other electronic devices.

A circuit board 14 is disposed in the housing 11. The heat source 12 is disposed inside the housing 11 on the circuit board 14. In this embodiment and some other embodiments, the heat source 12 is an arithmetic processing chip of a tablet computer, a mobile phone, or other electronic elements.

The heat dissipation device 13 is disposed inside the housing 11, and the heat dissipation device 13 is in thermal contact with the heat source 12. Specifically, the heat dissipation device 13 is attached to the heat source 12, so as to directly contact the heat source 12. The heat dissipation device 13, of the electronic device 10 of the disclosure, can effectively absorb heat generated by the heat source 12, so as to enable the heat source to operate normally.

The heat dissipation device 13 comprises a casing 131. In this embodiment and some other embodiments, the shape of the casing 131 is a rectangular cuboid or other cuboid shape. In this embodiment and some other embodiments, the material of the casing 131 is aluminum, copper, or other appropriate materials. A heat dissipation material 132 is disposed in the casing 131. The heat dissipation material 132 comprises 15 to 30 percent volume of multiple copper materials, 50 to 85 percent volume of a phase change material, and 15 to 20 percent volume of air. In a more particular embodiment, the heat dissipation material 132 comprises 15 to 20 percent volume of multiple copper materials, 64 to 67 percent volume of a phase change material, and a 16 to 17 percent volume of air. In this embodiment, the copper materials are copper tubes, copper partition plates, or other copper members. Also, the phase change material is an alkane such as paraffin. The phase change material absorbs heat to change from a solid state to a liquid state. During the process in which the phase change material absorbs the heat to change from the solid state to the liquid state, the temperature of the phase change material maintains the same value and does not rise. After the phase change material changes from the solid state to the liquid state, the volume of the phase change material is increased, but the air has excellent compressibility, which provides a space for the expansion of the phase change material. The purpose of the air comprised in the heat dissipation material 132 is to address the problem of the increased volume of the phase change material due to the phase change, enabling the space in the casing 131 to accommodate the increased volume of the phase change material.

Furthermore, the casing 131 of the heat dissipation device 13 has a surface 1311. The heat dissipation device 13 is in thermal contact with the heat source 12 through the surface 1311. A central area 1312 and an outer ring area 1313 are defined on the surface 1311. The outer ring area 1313 surrounds the central area 1312.

Moreover, each of the central area 1312, the surface 1311, and the heat dissipation device 13 in this embodiment has a geometric midpoint M. All of the geometric midpoints M overlap each other. The area of the central area 1312 is preferably 10% to 50% of the area of the surface 1311. In this particular embodiment, the area of the central area 1312 is about 10% of the area of the surface 1311. In some embodiments, the shape of the central area 1312 is a scaled-down, proportionally-reduced version of the shape of the surface 1311. A contact region A between the heat source 12 and the surface 1311 is located in the outer ring area 1313. The heat dissipation device 13 absorbs the heat of the heat source 12 through thermal conduction.

FIG. 2 illustrates the heat dissipation device 13 of FIG. 1. In this embodiment, the heat dissipation material 132 comprises multiple copper tubes 1321. The copper tubes 1321 are located inside the casing 131. The copper tubes 1321 extend from the central area 1312 towards the outer ring area 1313. One copper tube 1321 overlaps with the contact region A where the heat source 12 contacts the surface 1311 of the heat dissipation device 13, and the copper tube 1321 further passes through the geometric midpoint M of the heat dissipation device 13. Other copper tubes 1321 extend to four corner portions 1315 of the casing 131 of the heat dissipation device 13 respectively. Yet other copper tubes 1321 extend to four side edges 1314 of the casing 131 of the heat dissipation device 13. Generally, the copper tubes 1321 are disposed in the casing 131 in an evenly interwoven manner, and extend radially outward from the central area 1312 towards the outer ring area 1313 to, or at least near, the perimeter of the outer ring area 1313.

The disclosure is not necessarily limited to the number and the extension manner of the copper tubes 1321 illustrated in this particular embodiment. The number and the extension manner of the copper tubes 1321 may vary according to the shape of the heat dissipation device 13 and the position of the heat source 12.

When the heat source 12 transfers heat to one corner of the outer ring area 1313 of the heat dissipation device 13 through thermal conduction, the copper tubes 1321 rapidly transfer and disperse the heat to the central area 1312 and from there to the rest of the outer ring area 1313. The extension of the copper tubes 1321 to the corners of the heat dissipation device 13 spreads the heat more evenly, which in turn enables the entire phase change material in the heat dissipation device 13 to absorb the heat more evenly during phase change, improving the heat absorption efficiency of the heat dissipation device 13. The heat dissipation device 13 of this embodiment may be, but is not required to be, equipped with an exhaust fan, making it useful for a thin electronic device.

As previously noted, the heat dissipation material 132 in the heat dissipation device 13 comprises the phase change material. While undergoing the phase change, the phase change material absorbs heat without increasing the temperature of the phase change material. By selecting an appropriate phase change material, the temperature of the heat dissipation device 13 can be kept for a long time in a comfortable temperature state of between 15 and 45 degrees Celsius. For example, when a phase change material with the phase change temperature being about 37 degrees is selected, the heat dissipation device 13 is capable of being kept at that comfortable temperature for a long time as the phase change material absorbs heat. Therefore, when a user holds the electronic device 10 for a long time, the hand-scalding problem caused by the constant rise of the temperature of the housing 11 of the electronic device 10 incurred by the heat absorption of the heat dissipation device 13 is avoided.

Moreover, in this embodiment and some other embodiments, multiple sets of heat dissipation fins (not shown) are disposed on the surface of the heat dissipation device 13, so as to further improve the heat absorption efficiency of the heat dissipation device 13.

Figure 3:
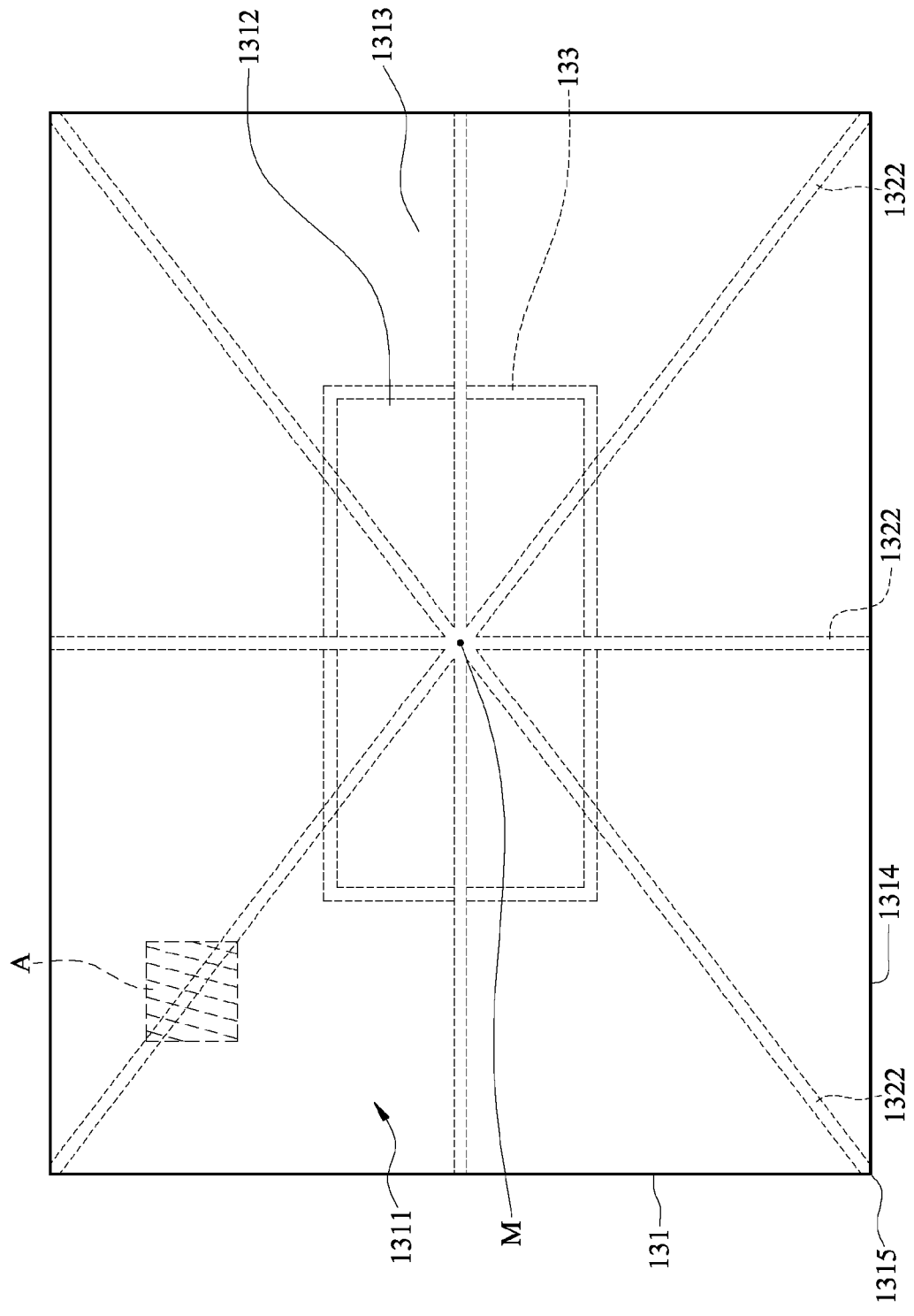
FIG. 3 is a bottom view of a heat dissipation device according to another embodiment of the disclosure.

Referring to FIG. 3, FIG. 3 is a bottom view of a heat dissipation device according to another embodiment of the disclosure.

In this embodiment, multiple copper materials comprised by a heat dissipation material 132 in a heat dissipation device 13a are multiple copper partition plates 1322, and the copper partition plates 1322 are evenly distributed and interwoven inside the casing 131. The copper partition plates 1322 extend from a central area 1312 towards an outer ring area 1313. One copper partition plate 1322 overlaps with a contact region A where a heat source 12 contacts a surface 1311 of the heat dissipation device 13a, and the copper partition plate 1322 further passes through a geometric midpoint M of the heat dissipation device 13a. Furthermore, some of the copper partition plates 1322 extend to four corner portions 1315 of the casing 131 of the heat dissipation device 13a respectively, and some of the copper partition plates 1322 extend to four side edges 1314 of the casing 131 of the heat dissipation device 13a. Specifically, the copper partition plates 1322 extend from the central area 1312 towards the outer ring area 1313 to expand as radially as possible.

Furthermore, a plurality of aluminum partition plates 133 are disposed in the casing 131. In this particular embodiment, the aluminum partition plates 133 are located between the central area 1312 and the outer ring area 1313, so as to form a rectangular frame body, thereby separating the central area 1312 from the outer ring area 1313. Also, a copper partition plate 1322 extends from each corner portions of the rectangular frame body, formed by the aluminum partition plates 133, to the respective corner portions 1315 of the casing 131, and another copper partition plate 1322 extends from each side edge of the rectangular frame body formed by the aluminum partition plates 133 to the respective side edge 1314 of the casing 131. The positions where the aluminum partition plates 133 are disposed in the casing 131 of this embodiment are not intended to limit the disclosure. Furthermore, the volume percent of the aluminum partition plates 133 is less than 3% of the volume percentage of the copper tubes 1321, so as to prevent the heat absorption effect of the heat dissipation device 13a from being lowered.

Moreover, by disposing the aluminum partition plates 133, the interior of the casing 131 is divided into at least two areas, so as to ensure that the phase change material of each area inside the casing 131 is evenly distributed, thereby avoiding the problem of the heat absorption efficiency of the heat dissipation device 13a being affected by uneven distribution of the phase change material due to accumulation of the phase change material in a specific area (for example, the bottom) in the casing 131, incurred by multiple phase changes and the influence of gravity.

When the heat source 12 transfers heat to one corner of the outer ring area 1313 of the heat dissipation device 13a through thermal conduction, the heat is rapidly transferred to the central area 1312 through the copper tubes 1321, and is transferred and dispersed from the central area 1312 to the rest of the outer ring area 1313 of the heat dissipation device 13a through the copper tubes 1321. Therefore, all corners of the heat dissipation device 13a can receive the heat evenly, so as to enable the entire phase change material in the heat dissipation device 13a to absorb the heat evenly to undergo the phase change, thereby improving the heat absorption efficiency of the heat dissipation device 13a.

According to the electronic device of the embodiment, the heat dissipation material comprises 15 to 30 percent volume of copper materials, 50 to 85 percent volume of the phase change material, and 15 to 20 percent volume of air, so as to enable the heat to be quickly transferred and dispersed to the entire heat dissipation device through the copper materials. Therefore, the entire phase change material in the heat dissipation device can absorb the heat evenly to undergo the phase change, so as to improve the heat absorption efficiency of the heat dissipation device. Furthermore, the heat dissipation material comprises the phase change material, so that in the heat absorption process of the heat dissipation device, the temperature of the heat dissipation device is capable of being kept for a long time in a comfortable temperature state for holding. Last but not least, the heat dissipation device of this embodiment is not required to be equipped with an exhaust fan, so that the heat dissipation device of this embodiment is applicable to a thin electronic device, and can reduce the generation of noise.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the disclosure pertains without departing from its spirit and scope. Accordingly, the scope of the disclosure is defined by the appended claims rather than the foregoing description and the exemplary embodiments described therein.

What is claimed is:

1. An electronic device, comprising:
   a housing;
   a heat source, located inside the housing; and
   a heat dissipation device, disposed inside the housing, the heat dissipation device being in thermal contact with the heat source, the heat dissipation device comprising a casing and heat dissipation material disposed in the casing, the heat dissipation material comprising 15 to 30 percent volume of multiple copper materials, 50 to 85 percent volume of a phase change material, and 15 to 20 percent volume of air, wherein the phase change material comprises an alkane;
   wherein the casing has a surface being in thermal contact with the heat source, a central area and an outer ring area are defined on the surface, the outer ring area surrounds the central area, a geometric midpoint of the central area and a geometric midpoint of the surface are overlapped with each other, the area of the central area is 10% to 50% of the area of the surface, the heat source is located in the outer ring area, and the heat dissipation device absorbs heat from the heat source through thermal conduction.

2. The electronic device according to claim 1, wherein the copper materials extend from the central area towards the outer ring area.

3. The electronic device according to claim 2, wherein the copper materials are multiple copper tubes or multiple copper partition plates.

4. The electronic device according to claim 2, wherein at least one of the copper materials overlaps a region where the heat source is in contact with the heat dissipation device.

5. The electronic device according to claim 2, wherein at least one of the copper materials passes through a geometric midpoint of the heat dissipation device.

6. The electronic device according to claim 2, wherein respective ones of the copper materials extend to each of the corner portions of the casing of the heat dissipation device.

7. The electronic device according to claim 2, wherein respective ones of the copper materials extend to each side edge of the casing of the heat dissipation device.

8. The electronic device according to claim 1, wherein a plurality of aluminum partition plates are disposed in the casing, wherein the volume of the aluminum partition plates is less than 3% of the volume of the copper materials.

9. The electronic device according to claim 8, wherein the aluminum partition plates surround a geometric midpoint of the heat dissipation device, and the copper materials are a plurality of copper partition plates that extend from corner portions and side edges of the aluminum partition plates to respective corner portions and side edges of the casing.

10. An electronic device comprising:
    a heat source;
    a housing enclosing the heat source;
    a heat dissipation device comprising air and phase change material enclosed within a casing, wherein the air is more compressible than the phase change material so that the air gives up volume to the phase change material as the phase change material changes phase to absorb heat;
    the casing having a surface, a portion of which is in direct contact with the heat source; and
    copper tubes or plates disposed within the casing to distribute heat through the casing.

11. The electronic device according to claim 10, wherein the phase change material changes phase between a solid state and a liquid state at a temperature between 15 and 45 degrees.

12. The electronic device according to claim 10, wherein the phase change material comprises an alkane.

13. The electronic device according to claim 10, wherein the phase change material comprises paraffin.

14. The electronic device according to claim 10, wherein the air in the heat dissipation device takes up at least 15 percent of the volume of the heat dissipation device when the phase change material is in a low heat phase state.

15. The electronic device according to claim 10, wherein the copper tubes or plates take up at least 15 percent of the volume of the heat dissipation device.

16. The electronic device according to claim 10, wherein the heat source contacts an outer ring area of the casing surface.

17. The electronic device according to claim 16, wherein the copper tubes or plates extend radially from a central area of the casing surface through the outer ring area toward a perimeter of the casing.

18. The electronic device according to claim 17, further comprising a plurality of aluminum partition plates disposed in the casing, wherein the volume of the aluminum partition plates is less than 3% of the volume of the copper materials.

19. The electronic device according to claim 18, wherein the aluminum partition plates surround a geometric midpoint of the heat dissipation device.

* * * * *